(12) United States Patent
Finn et al.

(10) Patent No.: US 10,989,913 B2
(45) Date of Patent: Apr. 27, 2021

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Andreas Finn, Dresden (DE); Frederic Njikam Njimonzie, Reutlingen (DE); Helmut Grutzeck, Kusterdingen (DE); Joerg Muchow, Munich (DE); Rainer Straub, Ammerbuch (DE)

(73) Assignee: Robert Bosch GmbH, Stuttgart (DE)

( * ) Notice: Subject to any disclaimer, the term of this patent is extended or adjusted under 35 U.S.C. 154(b) by 243 days.

(21) Appl. No.: 16/337,014

(22) PCT Filed: Sep. 25, 2017

(86) PCT No.: PCT/EP2017/074171
§ 371 (c)(1),
(2) Date: Mar. 27, 2019

(87) PCT Pub. No.: WO2018/072973
PCT Pub. Date: Apr. 26, 2018

(65) Prior Publication Data
US 2019/0219814 A1    Jul. 18, 2019

(30) Foreign Application Priority Data
Oct. 19, 2016   (DE) ............. 10 2016 220 514.5

(51) Int. Cl.
*G02B 26/08*   (2006.01)
*B81B 3/00*    (2006.01)

(52) U.S. Cl.
CPC .......... *G02B 26/085* (2013.01); *B81B 3/0045* (2013.01); *B81B 2201/042* (2013.01);
(Continued)

(58) Field of Classification Search
CPC   G02B 26/085; G02B 26/0841; B81B 3/0045; B81B 2201/042; B81B 2203/0118; B81B 2203/0307
(Continued)

(56) References Cited

U.S. PATENT DOCUMENTS

2016/0105090 A1*   4/2016   Sadaharu ........... G02B 26/0841
310/38

FOREIGN PATENT DOCUMENTS

DE        19963382 A1     7/2001
DE     102010064218 A1    6/2012

OTHER PUBLICATIONS

International Search Report for PCT/EP2017/074171, dated Dec. 4, 2017.

* cited by examiner

*Primary Examiner* — Euncha P Cherry
(74) *Attorney, Agent, or Firm* — Norton Rose Fulbright US LLP; Gerard Messina

(57) ABSTRACT

A micromechanical component having a mounting support, at least one coil winding held by at least one coil brace and comprising conductor tracks made from at least one electrically conductive material, at least one first subsection of the at least one coil winding being anchored on the associated coil brace, and an adjustable part, the at least one coil brace and the adjustable part being connected to each other and via at least one spring element to the mounting support in such a way that the adjustable part is adjustable about at least one axis of rotation in relation to the mounting support, and, while the at least one first subsection of the at least one coil winding is anchored on the associated coil brace, at least one second subsection of the same coil winding spans at least one gap formed in the associated coil brace as a cantilever subsection.

15 Claims, 7 Drawing Sheets

(52) U.S. Cl.
CPC ............... *B81B 2203/0118* (2013.01); *B81B 2203/0307* (2013.01)

(58) Field of Classification Search
USPC ...................................................... 359/221.2
See application file for complete search history.

MICROMECHANICAL COMPONENT AND METHOD FOR PRODUCING A MICROMECHANICAL COMPONENT

FIELD

The present invention relates to a micromechanical component. The present invention also relates to a method for producing a micromechanical component.

BACKGROUND INFORMATION

German Patent Application No. DE 10 2010 064 218 A1 describes a magnetically movable micromirror. The micromirror comprises two coil windings each held by a coil brace and a mirror connected to the two coil windings, the coil windings and the mirror being connected via two springs to a mounting support in such a way that the mirror is adjusted about an axis of rotation relative to the mounting support by supplying the coil windings with current and creating an outer magnetic field.

SUMMARY

The present invention provides a micromechanical component and a method for producing a micromechanical component.

In accordance with the present invention, by developing the at least one coil winding respectively as a coil winding having the at least one cantilever subsection or by developing the at least one gap in the at least one associated coil brace spanned by the at least one cantilever subsection, it is possible to reduce a moment of inertia of the at least one coil brace (relative to the axis of rotation). Accordingly, a (total) moment of inertia (relative to the axis of rotation) of the masses of the micromechanical component that are adjustable/adjusted in a rotary motion around the axis of rotation. The reduction of the (total) moment of inertia reduces an energy consumption/energy requirement of the micromechanical component of the present invention and thereby contributes toward relieving its energy supply and expanding its usability. Furthermore, the reduction of the (total) moment of inertia increases a natural frequency of a resonant oscillatory motion of the adjustable part about the axis of rotation, which often facilitates a targeted excitation of the resonant oscillatory motion (without co-exciting undesired oscillatory modes). As explained more precisely below, the reduction of the (total) moment of inertia also contributes toward increasing a fall resistance of the micromechanical component of the present invention.

In one advantageous specific embodiment of the micromechanical component in accordance with the present invention, the at least one cantilever subsection of the at least one coil winding comprises at least one coil winding subsection in which conductor track subsections of the conductor tracks have a maximum distance from the axis of rotation compared to further conductor track subsections of the same coil winding. Thus at least one subsection of the at least one coil brace is "economized" or "omitted", which due to its comparatively great distance from the axis of rotation would contribute significantly toward increasing the (total) moment of inertia.

Preferably, the conductor tracks of the at least one coil winding running perpendicularly across at least one edge, which is formed between at least one brace surface of the at least one coil brace that is fitted with the at least one first subsection of the at least one coil winding and an outer surface of the same coil brace bounding the respective adjacent gap. The fact that the conductor tracks run perpendicularly across the at least one respective edge contributes toward increasing a stability of the at least one coil winding. For the reduction of the (total) moment of inertia (relative to the axis of rotation) made possible by the present invention, it is thus not necessary, at least in this specific embodiment, to accept a reduction of the stability of the at least one coil winding.

For example, in accordance with the present invention, it is possible to fill interstitial volumes between two neighboring conductor tracks of the same coil winding with at least one electrically insulating material. The at least one electrically insulating material filled into the spaces between neighboring conductor tracks is also able to increase the stability of the coil winding.

Alternatively or in complementary fashion it is also possible in accordance with the present invention to develop on a side of the at least one coil winding facing the at least one coil brace an electrically insulating buffer layer at least between the at least one first subsection of the at least one coil winding and the respectively associated coil brace. Preferably, at least one cantilever subsection of the electrically insulating buffer layer on the at least one cantilever subsection of the at least one coil winding also spans the at least one gap. This too contributes toward increasing a stability of the respective coil winding.

In another advantageous specific embodiment of the present invention, the at least one coil brace comprises at least one first brace bar extending along or parallel to the axis of rotation and a second brace bar extending along or parallel to the axis of rotation, the adjustable part or an anchoring area of the adjustable part being situated between the first brace bar and the second brace bar. In particular, it is possible for the sole coil winding of the micromechanical component to be anchored exclusively on the first brace bar and the second brace bar. Likewise, it is possible for the micromechanical component to have exactly two coil windings, and for a first coil winding of the two coil windings to be anchored exclusively on the first brace bar and a second coil winding of the two coil windings to be anchored exclusively on the second brace bar. In both cases, the coil braces have only a relatively small moment of inertia relative to the axis of rotation.

Optionally, in accordance with an example embodiment of the present invention, the at least one coil brace may also comprise at least one crossbar extending perpendicularly to the axis of rotation. The sole coil winding of the micromechanical component may be anchored exclusively on the first brace bar, the second brace bar and the at least one crossbar. If the micromechanical component has exactly two coil windings, a first coil winding of the two coil windings may be anchored exclusively on the first brace bar and the at least one crossbar situated on it and a second coil winding of the two coil windings may be anchored exclusively on the second brace bar and the at least one crossbar situated on it. In these cases as well, the moments of inertia of the coil braces are comparatively low.

If the micromechanical component has exactly two coil windings, it is also possible that in each case a first support bar (44a, 44b) is situated on respectively a first end of the first and second brace bars (42a, 42b) and in each case a second support bar (46a, 46b) is situated respectively on a second end of the first and second brace bars (42a, 42b), and a first coil winding of the two coil windings may be anchored exclusively on the first brace bar, the situated first support bar and the situated second support bar and a second coil winding of the two coil windings may be anchored exclusively on the second brace bar, the situated first support bar and the situated second support bar. Thus, a low (total) moment of inertia (relative to the axis of rotation) of the masses of the micromechanical component that are adjustable/adjusted in a rotary motion around the axis of rotation is also ensured in this specific example embodiment.

For example, the micromechanical component may be a micromirror having an adjustable mirror disk as the adjustable part. The micromechanical component developed as a micromirror is versatile in application. It should be noted, however, that a development of the micromechanical component is not limited to micromirrors.

The advantages described above are also ensured in an implementation of a corresponding method for producing a micromechanical component. It should be noted that the production method in accordance with the specific embodiments of the micromechanical component explained above is capable of being developed further.

BRIEF DESCRIPTION OF THE DRAWINGS

Additional features and advantages of the present invention are explained below with reference to the figures.

DETAILED DESCRIPTION OF EXAMPLE EMBODIMENTS

Figure 1A:
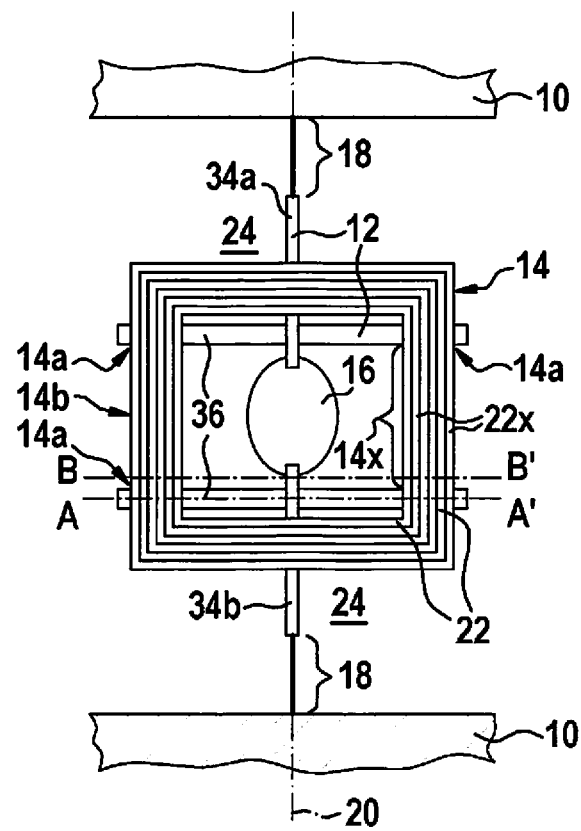
FIGS. 1a through d show schematic illustrations of a first specific embodiment of the micromechanical component.
Figure 1B:
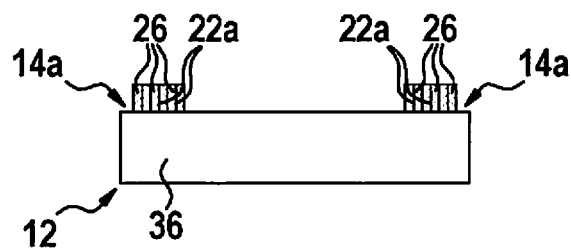
Figure 1C:
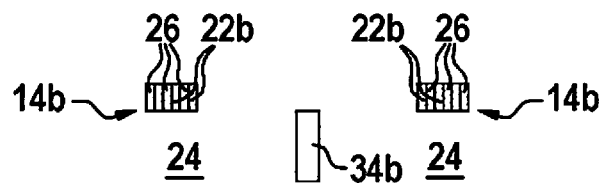
Figure 1D:
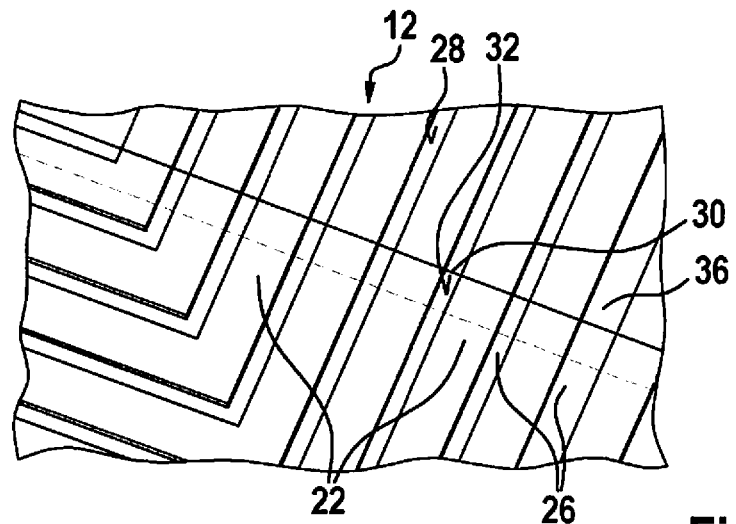

FIGS. 1a through 1d show schematic illustrations of a first specific embodiment of the micromechanical component, FIG. 1a showing a top view, FIG. 1b showing a cross section along a line A-A' of FIG. 1a, FIG. 1c showing a cross section along a line B-B' of FIG. 1a, and FIG. 1d showing an enlarged section of FIG. 1a.

The micromechanical component shown schematically in FIGS. 1a through 1d has a (partially drawn) mounting support 10 (e.g. a housing or housing part 10), at least one coil winding 14 held by at least one coil brace 12, and an adjustable part 16. The at least one coil brace 12 and the adjustable part 16 are connected to one another. Moreover, the at least one coil brace 12 and the adjustable part 16 are connected to mounting support 10 via at least one spring element 18 in such a way that the adjustable part 16 is adjustable in relation to mounting support 10 about at least one axis of rotation 20.

In the specific embodiment of FIGS. 1a through 1d, the micromechanical component is by way of example a micromirror having an adjustable mirror disk 16 as the adjustable part 16. It should be noted, however, that such a development of the micromechanical component is to be interpreted merely in exemplary fashion.

The at least one coil winding 14 comprises respectively conductor tracks 22 made of at least one electrically conductive material. Conductor tracks 22 may be made, for example, of copper (Cu) as the at least one electrically conductive material. It should be noted, however, that a development of the at least one coil winding 14/its conductor tracks 22 is not limited to the use of copper as the at least one electrically conductive material. The conductor tracks 22 may also be made of (doped) polysilicon, for example.

The at least one coil winding 14 is preferably part of a magnetic actuator device of the micromechanical component such that (during an operation of the micromechanical component) it is possible, by supplying current to conductor tracks 22 of the at least one coil winding 14 and effecting an external magnetic field, to transmit a Lorentz force in such a way onto the adjustable part 16 that the adjustable part 16 is adjusted about axis of rotation 20. In particular, it is possible to set the adjustable part 16 into a resonant oscillatory motion about axis of rotation 20. Since current and voltage signals suitable for supplying current to conductor tracks 22 and magnetic devices designed for effecting the external magnetic field are conventional, no further details are here provided in this regard.

At least one first subsection 14a of the at least one coil winding 14 is anchored (as at least one anchored subsection 14a) on the associated coil brace 12 (see FIG. 1b). This may also be expressed by saying that the at least one anchored subsection 14a of the at least one coil winding 14 contacts the associated coil brace 12 (directly or indirectly). In particular, the anchored conductor track subsections 22a of conductor tracks 22 (made of the at least one electrically conductive material), which lie in the at least one anchored subsection 14a of the at least one coil winding 14, are able to contact the associated coil brace 12 directly (see FIG. 1b). While the at least one first subsection/anchored subsection 14a of the at least one coil winding 14 is anchored on the associated coil brace 12, at least one second subsection 14b of the same coil winding 14 spans as cantilever subsection 14b at least one gap 24 formed in the associated coil brace 12 (see FIG. 1c). The at least one cantilever subsection 14b is thus connected to the associated coil brace 12 only via the at least one anchored subsection 14a of the same coil winding 14, without (directly) contacting the associated coil brace 12. In the event that the anchored conductor track subsections 22a of conductor tracks 22, which lie in the at least one anchored subsection 14a, contact the associated coil brace 12 directly, there exists no contact between cantilever conductor track subsections 22b of conductor tracks 22 (made of the at least one electrically conductive material), which lie in the at least one cantilever subsection 14b of the same coil winding 14, and the associated coil brace 12 (see FIG. 1c).

By developing the at least one cantilever subsection 14b on the at least one coil winding 14, or by developing the at least one gap 24, spanned by the at least one cantilever subsection 14b, in the at least one associated coil brace 12, it is possible to "economize" mass on the at least one coil brace 12. (For example, the "economized" mass of the at least one coil brace 12 may be omitted during material deposition.) Likewise, the "economized" mass of the at least one coil brace 12 may also be understood as a mass that was removed.) It is thus possible to develop the at least one coil brace 12 so as to have a lower moment of inertia (with respect to axis of rotation 20). Accordingly, it is possible to reduce a (total) moment of inertia (relative to the axis of rotation) of the masses 12, 14 and 16 of the micromechanical component that are adjustable/adjusted in a rotary motion around the axis of rotation 20.

By reducing the (total) moment of inertia of the adjustable masses 12, 14 and 16 of the micromechanical component (relative to axis of rotation 20) it is possible to reduce an energy required for adjusting the adjustable part 16 about axis of rotation 20. In addition, the reduction of the (total) moment of inertia causes an increase of a natural frequency of the resonant oscillatory motion of the adjustable part 16 about axis of rotation 20. Frequencies of unwanted oscillatory modes of adjustable part 16 may also be increased by reducing the (total) moment of inertia. The advantages of the frequency increases described here will be elucidated further below.

Preferably, the at least one gap 24 is filled (completely) with air, gas or vacuum. The at least one gap 24 formed in the at least one coil brace 12 may be understood for example as an interstitial volume spanned between subcomponents of the respective coil brace 12. The at least one gap 24 in particular may be patterned into the at least one coil brace 12, for example by at least one etching process. In this case, the at least one cantilever subsection 14b is produced by (partial) removal/etching away of the at least one material of the at least one coil brace 12. The at least one coil brace 12 is preferably formed from a semiconductor material such as silicon, for example. This facilitates patterning the at least one coil brace 12 in such a way that the at least one coil winding 14 held by it has at least one cantilever subsection 14b (in addition to the at least one subsection 14a anchored on associated coil brace 12). It should be noted, however, that the present invention ensures that the at least one coil brace 12 may also be easily developed using a different semiconductor material in place of or as a complement to silicon.

The at least one cantilever subsection 14a of the at least one coil winding 14 comprises at least one coil winding subsection 14x, in which (cantilever) conductor track subsections 22x of conductor tracks 22 have a maximum distance from axis of rotation 20 in comparison to additional conductor track subsections 22a or 22b of the same coil winding 14. This may also be expressed by saying that at least one coil winding subsection 14x, whose (cantilever) conductor track subsections 22x have the maximum distance from axis of rotation 20 (in comparison with additional conductor track subsections 22a or 22b of the same coil winding 14), is developed to be without coil brace by omitting or removing portions of the associated coil brace 12. The respective coil brace 12 thus has relatively little/no mass in at least one area distant from the axis (axis of rotation 20) of the associated coil winding. This contributes to an additional reduction of the moment of inertia of the at least one coil brace 12 (relative to axis of rotation 20), and thus to a further reduction of the (total) moment of inertia of the adjustable masses 12, 14 and 16 of the micromechanical component (relative to axis of rotation 20).

In the micromechanical component of FIGS. 1a through 1d, interstitial volumes between two adjacent conductor tracks 22 of the same coil winding 14 are filled with at least one electrically insulating material 26. Silicon oxide and/or silicon nitride may be used as the at least one electrically insulating material. Thus, it is possible to use comparatively cost-effective materials that are also easy to process. It should be noted, however, that the materials mentioned here are to be interpreted merely in exemplary fashion. By filling the interstitial volumes between adjacent conductor tracks 22 with the at least one electrically insulating material 26, the at least one coil winding 14 is developed in a relatively compact manner (both on its at least one anchored subsection 14a as well as on its at least one cantilever subsection 14b). Thus, in spite of the implementation of the at least one cantilever subsection 14b, the at least one coil winding 14 has a high degree of stability. The at least one coil winding 14 may therefore continue to be used reliably as part of a magnetic actuator device. Alternatively, however, it is also possible for there to be air, gas or vacuum in the interstitial volumes between two adjacent conductor tracks 22 of the same coil winding 14, which are used as "insulator" for the at least one coil winding 14.

FIG. 1d shows (partially) a brace surface 28 of the associate coil brace 12 fitted with the at least one anchored subsection 14a of the at least one coil winding 14. An edge 30 developed on the same coil brace 12 is also shown, which is developed between brace surface 28 and an outer surface 32 of the same coil brace 12 that bounds the adjacent gap 24. (The outer surface 32 bounding the adjacent gap 24 may be structured in particular by coil brace 12.) FIG. 1d shows that conductor tracks 22 of the respective coil winding 14 run perpendicularly across edge 30. Stated differently, conductor tracks 22 of the respective coil winding 14 are oriented above edge 30 perpendicularly with respect to edge 30. This perpendicular orientation of conductor tracks 22 on edge 30 increases a local stability of conductor tracks 22. Accordingly, the conductor tracks 22 of the at least one coil winding 14 may also run perpendicularly across other edges (not shown), which are developed between the at least one brace surface 28 of the at least one coil brace 12 and at least one further outer surface 32 of the at least one coil brace 12 that bounds the respectively adjacent gap 24. (In this case, the conductor tracks 22 of the at least one coil winding 14 are also oriented over the at least one further edge perpendicularly to the respective edge.) This contributes toward the additional increase of the stability of the at least one coil winding 14.

The specific embodiment of FIGS. 1a through 1d has by way of example only one single coil winding 14. The (single) coil brace 12 of the single coil winding 14 comprises a first brace bar 34a extending along axis of rotation 20 and a second brace bar 34b extending along axis of rotation 20, the adjustable part 16 or an anchoring area (not shown) of adjustable part 16 being situated between first brace bar 34a and second brace bar 34b. In particular, the (single) coil winding 14 may be anchored (by the at least one anchored subsection 14a) merely on first brace bar 34a and on second brace bar 34b. In this case, the (single) coil brace 12 is constructed/formed merely from first brace bar 34a and second brace bar 34b. The (single) coil brace 12 is thus able to be implemented using a relatively low moment of inertia (with respect to axis of rotation 20).

In exemplary fashion, the (single) coil brace 12 of the micromechanical component of FIGS. 1a through 1d comprises additionally at least one (optional) crossbar 36 extending perpendicularly to the axis of rotation 20, on which the single coil winding 14 is anchored sectionally (i.e., by the at least one anchored subsection 14a). The at least one crossbar 36 may be firmly attached to first brace bar 34a, to second brace bar 34b, to adjustable part 16 and/or to the anchoring section of adjustable part 16. Preferably, the at least one crossbar 36 is designed in mirror symmetry with respect to a mirror symmetry plane comprising the axis of rotation 20. The at least one crossbar 36 additionally may be positioned in such a way that the micromechanical component is designed in mirror symmetry also with respect to an additional mirror symmetry plane that is oriented perpendicularly with respect to axis of rotation 20 and that intersects the adjustable part 16 centrally. (In the specific embodiment of FIGS. 1a through 1d, the first brace bar 34a is also in mirror symmetry with respect to the additional mirror symmetry plane of second brace bar 34b.)

Advantageously, in the specific embodiment of FIGS. 1a through 1d, the (single) coil winding 14 is anchored exclusively on first brace bar 34a, on second brace bar 34b and on the at least one (optional) crossbar 36. Stated differently, the (single) coil brace 12 is constructed/formed exclusively from first brace bar 34a, second brace bar 34b and the at least one crossbar 36. In this case as well, the (single) coil brace has a relatively low moment of inertia.

Figure 2A:
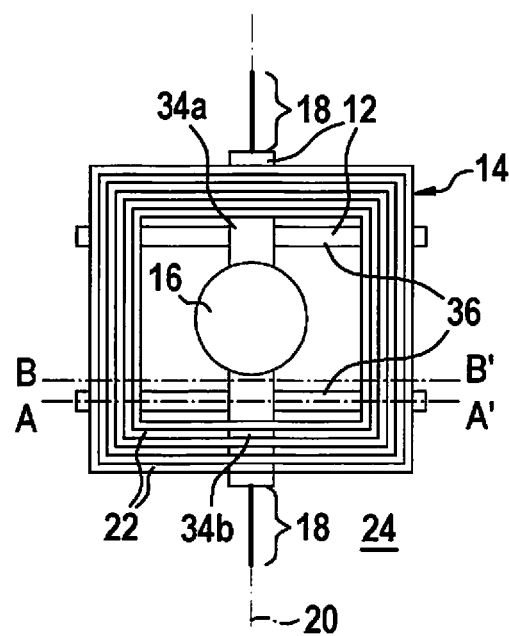
FIGS. 2a through 2c show schematic illustrations of a second specific embodiment of the micromechanical component.
Figure 2B:
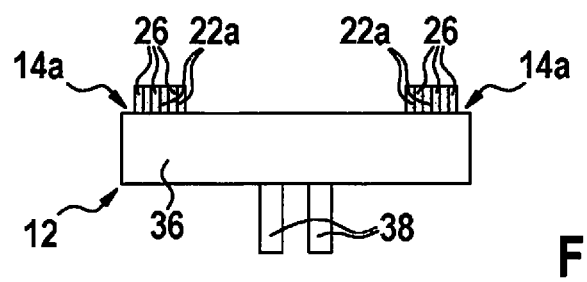
Figure 2C:
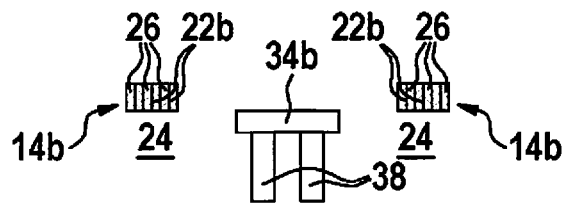

FIGS. 2a through 2c show schematic illustrations of a second specific embodiment of the micromechanical component, FIG. 2a showing a top view, FIG. 2b showing a cross section along a line A-A' of FIG. 2a, and FIG. 2c showing a cross section along a line B-B' of FIG. 2a.

The specific embodiment shown schematically in FIGS. 2a through 2c differs from the previously explained micromechanical component merely by the fact that first brace bar 34a and second brace bar 34b have a greater width (in the direction perpendicular to axis of rotation 20) and that respectively two support ribs 38 (extending along the axis of rotation 20 and being in mirror symmetry with respect to the mirror symmetry plane comprising the axis of rotation 20) are developed on first brace bar 34a and second brace bar 34b. Regarding further features of the specific embodiment of FIGS. 2a through 2c, reference is made to the previously explained micromechanical component.

Figure 3A:
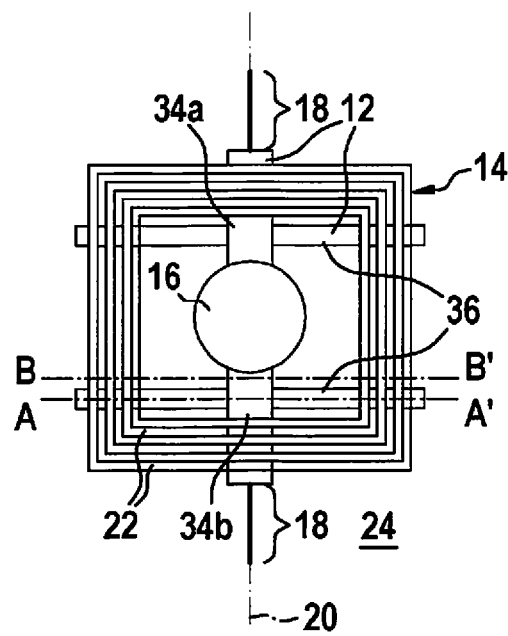
FIGS. 3a through 3c show schematic illustrations of a third specific embodiment of the micromechanical component.
Figure 3B:
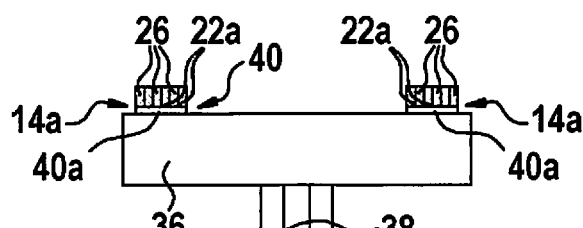
Figure 3C:
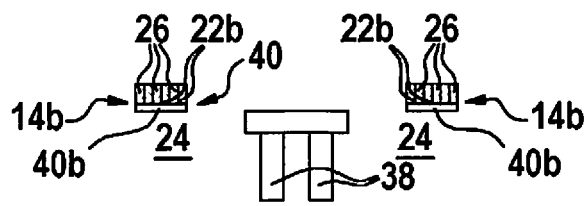

FIGS. 3a through 3c show schematic illustrations of a third specific embodiment of the micromechanical component, FIG. 3a showing a top view, FIG. 3b showing a cross section along a line A-A' of FIG. 3a, and FIG. 3c showing a cross section along a line B-B' of FIG. 3a.

As a further development of the previously described specific embodiment, the micromechanical component of FIGS. 3a through 3c additionally has an electrically insulating buffer layer 40, which is developed on a side of the at least one coil winding 14 that is facing the at least one coil brace 12. The electrically insulating buffer layer 40 exists both between the at least one first/anchored subsection 14a of the at least one coil winding 14 and the respectively associated coil brace 12 (see FIG. 3b) as well as on the at least one cantilever subsection 14b of the at least one coil winding 14 so that at least one cantilever subsection 40b of the electrically insulating buffer layer 40 also spans the at least one gap 24 (see FIG. 3c). (While at least one anchored subsection 40a of electrically insulating buffer layer 40 contacting the at least one anchored subsection 14a directly contacts the associated coil brace 12, the at least one cantilever subsection 40b of electrically insulating buffer layer 40 contacting the at least one cantilever subsection 14b exists without a direct contact to coil brace 12.) The electrically insulating buffer layer 40 thus improves not only an electrical insulation between conductor tracks 22 and the coil brace 12 that bears it, but rather also increases a stability of the at least one cantilever subsection 14b of the respective coil winding 14.

The electrically insulating buffer layer 40 may be formed for example from silicon oxide and/or silicon nitride. Thus it is possible to use comparatively cost-effective materials that are also easy to process for the electrically insulating buffer layer 40. It is pointed out, however, that an ability to develop the electrically insulating buffer layer 40 is not limited to the use of a specific material or material mixture. The electrically insulating buffer layer 40 may also have a multi-layered structure.

Regarding further features of the specific embodiment of FIGS. 3a through 3c, reference is made to the previously explained micromechanical components. As in the specific embodiment of FIGS. 1a through 1d, it is additionally possible to develop first brace bar 34a and second brace bar 34b (in the direction perpendicular to axis of rotation 20) in narrower fashion and/or without support ribs 38.

Figure 4A:
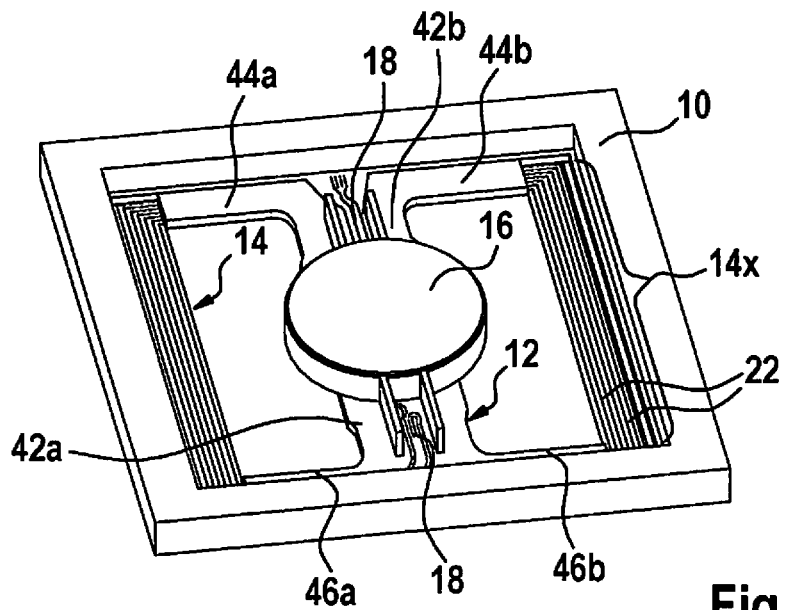
FIGS. 4a and 4b show schematic illustrations of a fourth specific embodiment of the micromechanical component.
Figure 4B:
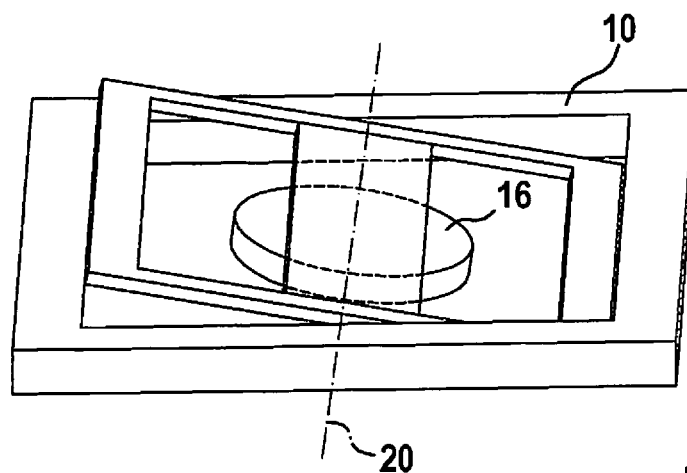

FIGS. 4a and 4b show schematic representations of a fourth specific embodiment of the micromechanical component, FIG. 4a showing the adjustable part of the micromechanical component in its position of rest, and FIG. 4b showing the adjustable part of the micromechanical component in its resonant oscillatory motion.

In contrast to the previously described specific embodiments, the micromechanical component of FIGS. 4a and 4b has two coil windings 14, which are developed in mirror symmetry with respect to the mirror symmetry plane comprising axis of rotation 20. A separate coil brace 12 is assigned to each of the two coil windings 14, the two coil braces 12 also being developed in mirror symmetry with respect to the mirror symmetry plane comprising axis of rotation 20. A first coil brace 12 of the two coil braces 12 comprises the first brace bar 42a extending parallel to axis of rotation 20, while a second coil brace 12 of the two coil braces 12 has the second brace bar 42b extending parallel to axis of rotation 20, the adjustable part 16 or the anchoring area of adjustable part 16 being situated between first brace bar 42a and second brace bar 42b. First brace bar 42a is situated on a first side of axis of rotation 20 and is assigned to a first coil winding 14 of the two coil windings 14, while second brace bar 42b is developed on a second side of axis of rotation 20 and is assigned to a second coil winding 14 of the two coil windings 14. In particular, first coil winding 14 may be anchored (by its at least one anchored subsection 14a) exclusively on first brace bar 42a and second coil winding 14 may be anchored (by its at least one anchored subsection 14a) merely on second brace bar 42b. In this case, first coil brace 12 is formed/constructed merely from first brace bar 42a, and second coil brace is formed/constructed exclusively from second brace bar 42b. The two brace bars may thus be developed having a relatively small moment of inertia (with respect to axis of rotation 20).

In the specific embodiment of FIGS. 4a and 4b, respectively a first support bar 44a or 44b are attached respectively to a first end of the first and second brace bars 42a and 42b, and respectively a second support bar 46a or 46b are attached respectively to a second end of the first and second brace bars 42a and 42b, support bars 44a, 44b, 46a and 46b extending perpendicularly away from axis of rotation 20. Advantageously, first coil winding 14 is anchored (by its at least one anchored subsection 14a) exclusively on first brace bar 42a, on attached first support bar 44a and on attached second support bar 46a, and second coil winding 14 is anchored (by its at least one anchored subsection 14a) merely on second brace bar 42b, attached first support bar 44b and attached second support bar 46b. The first coil brace 12 is thus formed/constructed merely from first brace bar 42a, attached first support bar 44a and attached second support bar 46a, and second coil brace 12 is thus formed/constructed exclusively from second brace bar 42b, attached first support bar 44b and attached second support bar 46b. (One form of coil braces 12 may thus be described as "bracket-shaped".) Both coil braces 12 therefore has a low moment of inertia (with respect to axis of rotation 20). (Additionally, in this specific embodiment as well, the at least one cantilever subsection 14a of the at least one coil winding 14 comprises at least one coil winding subsection 14x, in which (cantilever) conductor track subsections 22x of conductor tracks 22 have a maximum distance from axis of rotation 20 in comparison to additional conductor track subsections 22a or 22b of the same coil winding 14.)

Figure 5A:
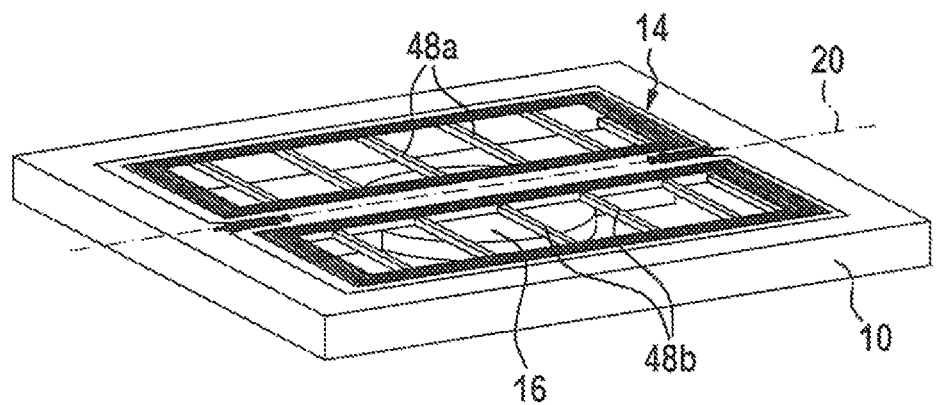
FIGS. 5a through 5d show schematic illustrations of a fifth specific embodiment of the micromechanical component.
Figure 5B:
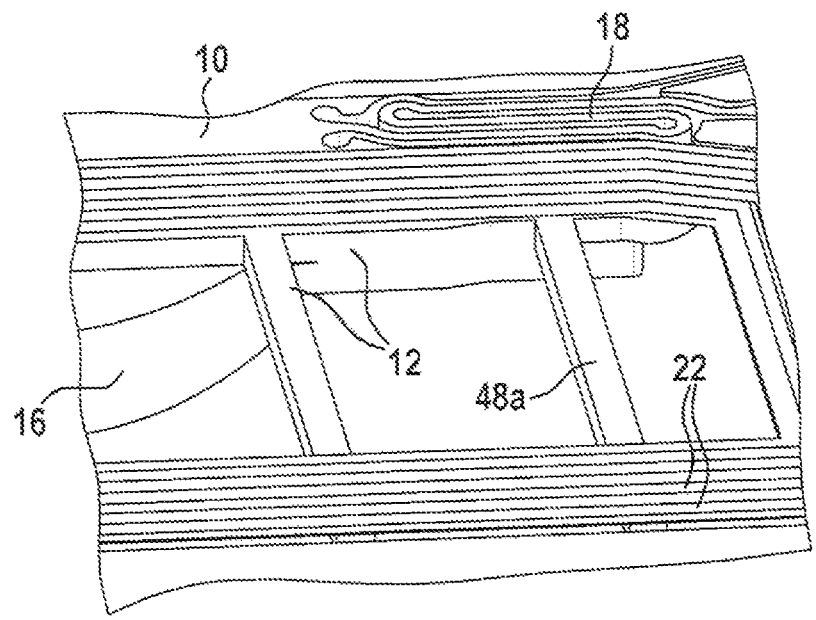
Figure 5C:
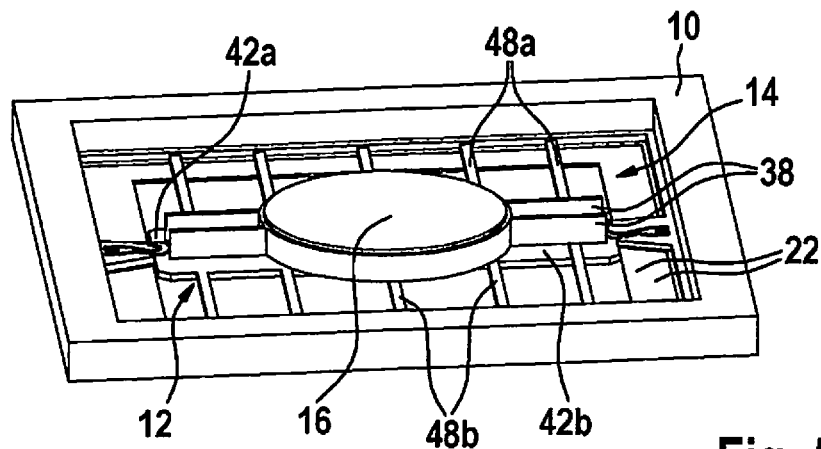
Figure 5D:
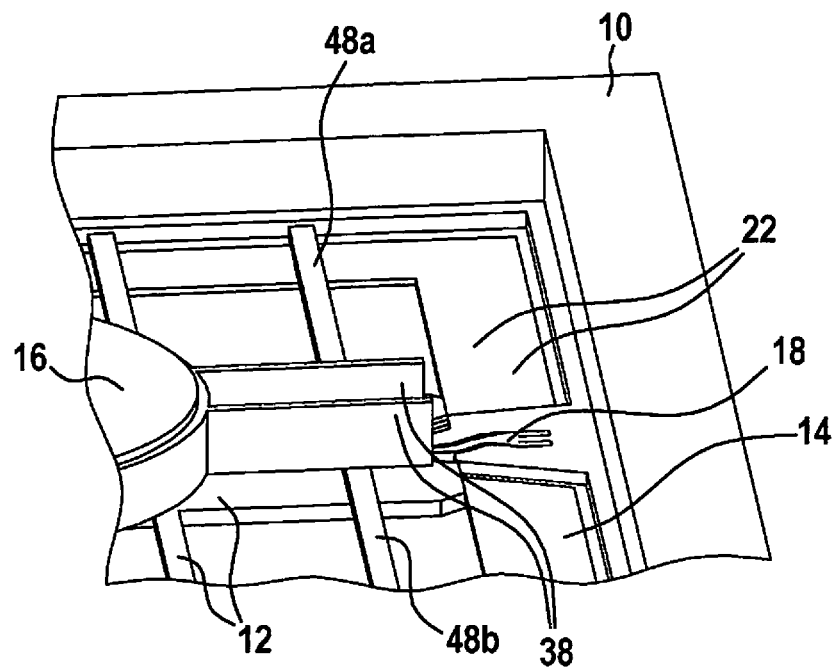

FIGS. 5a through 5d show schematic representations of a fifth specific embodiment of the micromechanical component, FIG. 5a showing a coil-equipped first side of the micromechanical component, FIG. 5b showing an enlarged section of FIG. 5a, FIG. 5c showing a second side of the micromechanical component facing away from the first side, and FIG. 5d showing an enlarged section from FIG. 5c.

In the specific embodiment of FIGS. 5a through 5d, in contrast to the previously described micromechanical component, crossbars 48a or 48b are fastened (in place of support bars 44a, 44b, 46a and 46b) on first brace bar 42a and on second brace bar 42b, which extend perpendicularly away from axis of rotation 20. Crossbars 48a of first coil brace 12 are developed in mirror symmetry to crossbars 48b of second coil brace 12 with respect to the mirror symmetry plane comprising axis of rotation 20. Advantageously, first coil winding 14 is anchored (by its at least one anchored subsection 14a) exclusively on first brace bar 42a and the at least one fastened crossbar 48a, and second coil winding 14 is anchored (by its at least one anchored subsection 14a) merely on second brace bar 42b and the at least one fastened crossbar 42b and the at least one fastened crossbar 48a. For this reason, first coil brace 12 is formed/constructed merely from first brace bar 42a and the at least one fastened crossbar 48a, and the second coil brace 12 is formed/constructed exclusively from second brace bar 42b and the at least one fastened crossbar 48b. The two coil braces 12 consequently have a low moment of inertia (with respect to axis of rotation 20). Regarding further features of the micromechanical component of FIGS. 5a through 5d, reference is made to the previously described specific embodiments.

In all micromechanical components described above, coil braces 12 have a relatively low moment of inertia (with respect to axis of rotation 20). Accordingly, the (total) moment of inertia (relative to axis of rotation 20) of the masses 12, 14 and 16 of the above-described micromechanical components that are adjustable/adjusted in a rotary motion around the axis of rotation 20 is comparatively small. A natural frequency of the resonant oscillatory motion of the adjustable part 16 about axis of rotation 20 relative to mounting support 10 is therefore comparatively high. (For example, in the specific embodiment of FIGS. 4a and 4b, the natural frequency is increased from 0.76 kHz to 1.1 kHz.) Accordingly, frequencies of unwanted oscillatory modes (such as, e.g., a "lateral" oscillatory mode of the adjustable part 16 within a plane spanned by the at least one coil winding 14 and a "perpendicular" oscillatory mode of the adjustable part 16 perpendicularly out of the plane spanned by the at least one coil winding 14) are also increased. The reduction of the (total) moment of inertia (relative to axis of rotation 20) may thus be used not only for defining a desired natural frequency of the resonant oscillatory motion of the adjustable part 16 about axis of rotation 20, but also for avoiding/suppressing the unwanted oscillatory modes.

In all of the micromechanical components described above, bi-metal effects, or intrinsic stresses resulting from them, are additionally avoided. In particular, there is no danger of a deformation of the at least one coil brace 12 even in the case of a significant temperature change in the surroundings of the respective micromechanical component.

The micromechanical components described above also have a comparatively high fall resistance. The achieved reduction of the moment of inertia of the at least one coil brace 12 (relative to axis of rotation 20) reduces a load on the at least one spring 18 in the event of a strike/impact of the respective micromechanical component.

Figure 6:
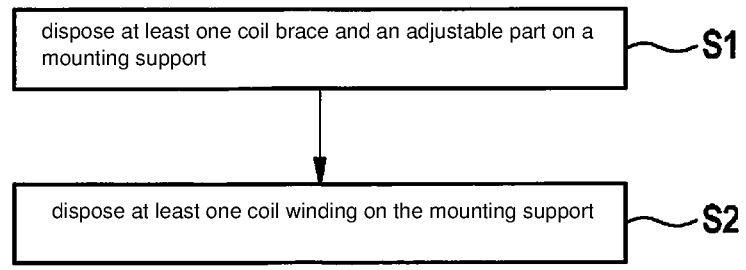
FIG. 6 shows a flow chart for explaining a specific embodiment of the production method for a micromechanical component.

FIG. 6 shows a flow chart for explaining a specific example embodiment of the production method for a micromechanical component.

In a method step S1, at least one coil brace and an adjustable part are disposed on a mounting support. The coil brace and the adjustable part are connected to one another and via at least one spring element on the mounting support in such a way that the adjustable part is suspended on the mounting support so as to be adjustable about at least one axis of rotation relative to the mounting support.

In another method step S2, at least one coil winding held by the at least one coil brace and comprising conductor tracks made of at least one electrically conductive material is also disposed on the (later) mounting support. At least one first subsection of the at least one coil winding is anchored on the associated coil brace. While the at least one first subsection of the at least one coil winding is anchored on the associated coil brace, however, at least one gap formed in the associated coil brace is spanned by at least one second subsection of the same coil winding as a cantilever subsection.

The production method described here also produces all of the advantages explained above. Method steps S1 and S2 may be performed in any order, in a partially coinciding manner or simultaneously. Furthermore, the production method may be developed further in accordance with the specific embodiments explained above.

The at least one coil brace for example may be patterned out of a semiconductor layer of a thickness of 35 μm to 50 μm. For forming the at least one coil winding, first a layer made of the at least one electrically insulating material may be deposited (for example to a height between 3 to 8 μm). Subsequently, trenches may be patterned into the layer, which are afterwards filled with the electrically conductive material of the conductor tracks, such as copper, for example.

What is claimed is:

1. A micromechanical component, comprising:
    a mounting support;
    at least one coil winding held by at least one coil brace, the at least one coil winding including conductor tracks made of at least one electrically conductive material, at least one first subsection of the at least one coil winding being anchored on the at least one coil brace; and
    an adjustable part, the at least one coil brace and the adjustable part being connected to one another and via at least one spring element to the mounting support in such a way that the adjustable part is adjustable in relation to the mounting support about at least one axis of rotation;
    wherein, while the at least one first subsection of the at least one coil winding is anchored on the associated coil brace, at least one second subsection of the same coil winding spans as cantilever subsection at least one gap formed in the at least one coil brace.

2. The micromechanical component as recited in claim 1, wherein the at least one cantilever subsection of the at least one coil winding includes at least one coil winding subsection, in which conductor track subsections of conductor tracks have a maximum distance from axis of rotation in comparison to additional conductor track subsections of the same coil winding.

3. The micromechanical component as recited in claim 1, wherein the conductor tracks of the at least one coil winding running perpendicularly across at least one edge, which is formed between at least one brace surface of the at least one coil brace, which is fitted with the at least one first subsection of the at least one coil winding, and an outer surface of the same coil brace bounding a respective adjacent gap of the coil brace.

4. The micromechanical component as recited in claim 1, wherein interstitial volumes between two neighboring conductor tracks of the same coil winding are filled with at least one electrically insulating material.

5. The micromechanical component as recited in claim 1, wherein on a side of the at least one coil winding facing the at least one coil brace an electrically insulating buffer layer is developed at least between the at least one first subsection of the at least one coil winding and the at least one coil brace.

6. The micromechanical component as recited in claim 5, wherein at least one cantilever subsection of the electrically insulating buffer layer also spans the at least one gap on the at least one cantilever subsection of the at least one coil winding.

7. The micromechanical component as recited in claim 1, wherein the at least one coil brace includes at least one first brace bar extending along or parallel to the axis of rotation and a second brace bar extending along or parallel to the axis of rotation, the adjustable part or an anchoring area of the adjustable part being situated between the first brace bar and the second brace bar.

8. The micromechanical component as recited in claim 7, wherein the coil winding of the micromechanical component is anchored exclusively on the first brace bar and the second brace bar.

9. The micromechanical component as recited in claim 7, wherein the micromechanical component has exactly two coil windings, and a first coil winding of the two coil windings is anchored exclusively on the first brace bar and a second coil winding of the two coil windings is anchored exclusively on the second brace bar.

10. The micromechanical component as recited in claim 7, wherein the at least one coil brace also includes at least one crossbar extending perpendicularly to the axis of rotation.

11. The micromechanical component as recited in claim 10, wherein the coil winding of the micromechanical component is anchored exclusively on the first brace bar, the second brace bar and the at least one crossbar.

12. The micromechanical component as recited in claim 10, wherein the micromechanical component has exactly two coil windings, and a first coil winding of the two coil windings is anchored exclusively on the first brace bar and the at least one situated crossbar, and a second coil winding of the two coil windings is anchored exclusively on the second brace bar and the at least one crossbar.

13. The micromechanical component as recited in claim 7, wherein the micromechanical component has exactly two coil windings, in each case a first support bar is situated on respectively a first end of the first and second brace bars and in each case a second support bar is situated respectively on a second end of the first and second brace bars, and a first coil winding of the two coil windings is anchored exclusively on the first brace bar, the situated first support bar and the situated second support bar and a second coil winding of the two coil windings is anchored exclusively on the second brace bar, the situated first support bar and the situated second support bar.

14. The micromechanical component as recited in claim 1, wherein the micromechanical component is a micromirror having an adjustable mirror disk as the adjustable part.

15. A method for producing a micromechanical component, comprising:
disposing at least one coil winding held by at least one coil brace and including conductor tracks made of at least one electrically conductive material and at least one adjustable part on a mounting support, at least one first subsection of the at least one coil winding being anchored on the coil brace, and the coil brace and the adjustable part being connected to each other and via at least one spring element to the mounting support in such a way that the adjustable part is attached to the mounting support so as to be adjustable about at least one axis of rotation in relation to the mounting support;
wherein while the at least one first subsection of the at least one coil winding is anchored on the coil brace, at least one gap formed in the associated coil brace is spanned by at least one second subsection of the coil winding as a cantilever subsection.

\* \* \* \* \*